United States Patent
Zhang et al.

(10) Patent No.: US 12,147,713 B2
(45) Date of Patent: Nov. 19, 2024

(54) HIGH-BANDWIDTH DDR DIMM, MEMORY SYSTEM, AND OPERATION METHOD THEREOF

(71) Applicant: INNOSILICON MICROELECTRONICS (ZHUHAI) CO., LTD., Zhuhai (CN)

(72) Inventors: Liang Zhang, Zhuhai (CN); Jiayun Zhang, Zhuhai (CN); Jiechen Shou, Zhuhai (CN); Chuanhao Xu, Zhuhai (CN); Ming Huang, Zhuhai (CN)

(73) Assignee: INNOSILICON MICROELECTRONICS (ZHUHAI) CO., LTD., Zhuhai (CN)

( * ) Notice: Subject to any disclaimer, the term of this patent is extended or adjusted under 35 U.S.C. 154(b) by 117 days.

(21) Appl. No.: 18/081,640

(22) Filed: Dec. 14, 2022

(65) Prior Publication Data

US 2024/0053898 A1    Feb. 15, 2024

Related U.S. Application Data (63) Continuation of application No. PCT/CN2022/121590, filed on Sep. 27, 2022.

(30) Foreign Application Priority Data

Aug. 9, 2022   (CN) .......................... 202210952285.3

(51) Int. Cl.
  *G06F 3/06*     (2006.01)
  *G06F 1/12*     (2006.01)
  (Continued)

(52) U.S. Cl.
  CPC .............. *G06F 3/0673* (2013.01); *G06F 1/12* (2013.01); *G11C 7/1042* (2013.01); *G11C 7/109* (2013.01);
  (Continued)

(58) Field of Classification Search
  CPC ....... G06F 3/0673; G06F 1/12; G11C 7/1042; G11C 7/109; G11C 11/4093; G11C 11/4096
  See application file for complete search history.

(56) References Cited

U.S. PATENT DOCUMENTS

| | | | |
|---|---|---|---|
| 2009/0106460 A1* | 4/2009 | Suenaga ................... | G06F 1/12 710/13 |
| 2019/0043552 A1* | 2/2019 | Alameer ................. | G06F 12/08 |

(Continued)

*Primary Examiner* — Glenn A. Auve (57) ABSTRACT

The present disclosure discloses a high-bandwidth double data rate (DDR) dual-in-line memory module (DIMM), a memory system, and an operation method of the memory system. The high-bandwidth DDR DIMM includes a first sub-channel, a second sub-channel, a register and divided clock driver, and a combined data buffer, where each of the sub-channels includes a first pseudo channel and a second pseudo channel, each pseudo channel including a plurality of dynamic random-access memory (DRAM) chips; the register and divided clock driver is configured to determine a command mode in response to a command sent by a host and send the command to the first pseudo channel and/or the second pseudo channel according to the command mode; and the combined data buffer is configured to interleave data of the first pseudo channel and the second pseudo channel According to the present disclosure, without having to change the original command sending approach, the register and divided clock driver determines various command modes in response to received commands, and then sends each command to a plurality of pseudo channels simultaneously or separately, thus achieving faster and more effective reading of data.

20 Claims, 4 Drawing Sheets

(51) Int. Cl.
  *G11C 7/10* (2006.01)
  *G11C 11/4093* (2006.01)
  *G11C 11/4096* (2006.01)

(52) U.S. Cl.
  CPC ...... *G11C 11/4093* (2013.01); *G11C 11/4096* (2013.01)

(56) References Cited

U.S. PATENT DOCUMENTS

| | | | |
|---|---|---|---|
| 2021/0216238 A1* | 7/2021 | Nale | G11C 11/4096 |
| 2021/0225418 A1* | 7/2021 | Kwon | G11C 7/1057 |
| 2022/0229790 A1* | 7/2022 | Nale | G06F 13/409 |
| 2023/0071117 A1* | 3/2023 | Alameer | G11C 7/109 |
| 2023/0136996 A1* | 5/2023 | Thoziyoor | G06F 3/0635 |
| | | | 711/154 |
| 2023/0178121 A1* | 6/2023 | Nygren | G11C 7/222 |
| | | | 365/189.05 |
| 2023/0418772 A1* | 12/2023 | Kanayama | G06F 13/1689 |

* cited by examiner

HIGH-BANDWIDTH DDR DIMM, MEMORY SYSTEM, AND OPERATION METHOD THEREOF

TECHNICAL FIELD

The present disclosure belongs to the field of memory technology and, more specifically to a high-bandwidth double data rate (DDR) dual-in-line memory module (DIMM), a memory system, and an operation method thereof.

BACKGROUND

The widely used DDR synchronous dynamic random access memory (SDRAM) (also known as DRAM) standard is applicable to DDR4 and DDR5 memories, and provides a channel that can support DIMM devices, which can record data at the rising edges and falling edges of clocks.

Due to the continuous development of DRAM technology, the I/O speed gap between the DRAM and the host/controller is gradually increasing. However, adding more DDR channels to increase the DIMM bandwidth is not an effective solution due to limited routing resources on packages, DIMMs and PCBs.

In a standard Loaded Reduced DIMM (LRDIMM) system, the frequency of a input command and address (DCA) interface (i.e., an interface between the host and the register clock driver (RCD)) is equal to that of an output command and address (QCA) interface (i.e., an interface between the RCD and DRAM). A data buffer (DB) forwards data directly between DRAM and host interfaces.

The industry has proposed a high-bandwidth DIMM (HBDIMM) that doubles the data rate of the DCA interface, while halving the frequency of the QCA interface relative to the frequency of the DCA interface. One same channel of the HBDIMM is divided into an A-side and a B-side, which are called pseudo channels (PCs), and QCA interfaces of the two pseudo channels are logically controlled by the DCA, so that the width of the QCA is twice that of the DCA, thus balancing the bandwidth of DCA/QCA. The frequency halving of the QCA makes it possible to double the bandwidth of the existing DRAM system. However, since the I/O speed of the DRAM is still limited by the development process of the existing DRAM, it is difficult to further reduce the I/O speed gap between the DRAM and the host/controller.

SUMMARY

In view of the above defects or need for improvement of the prior art, the present disclosure provides a high-bandwidth DDR DIMM that can effectively improve data transmission efficiency, thus effectively solving the problem of the I/O speed gap between DRAM and a host/controller.

In order to achieve the above objective, according to one aspect of the present disclosure, there is provided a high-bandwidth DDR DIMM, including: a first sub-channel, a second sub-channel, a register and divided clock driver, and a combined data buffer, where each of the sub-channels comprises a first pseudo channel and a second pseudo channel, each pseudo channel comprising a plurality of dynamic random-access memory (DRAM) chips; the register and divided clock driver is configured to determine a command mode in response to a command sent by a host and send the command to the first pseudo channel and/or the second pseudo channel according to the command mode; and the combined data buffer is configured to interleave data of the first pseudo channel and the second pseudo channel.

In some embodiments, the register and divided clock driver is further configured to perform, in response to an input clock cycle thereof, odd/even phase synchronization with the host, where an odd-numbered input clock cycle of the register and divided clock driver corresponds to an odd-numbered phase of the host, and an even-numbered input clock cycle of the register and divided clock driver corresponds to an even-numbered phase of the host.

In some embodiments, in the case where a double-UI command is sent by the host, the register and divided clock driver is further configured to select a command mode from a plurality of different command modes according to at least one flag bit in the double-UI command.

In some embodiments, in the case where a single-UI command is sent by the host, the register and divided clock driver is further configured to send the command to the first pseudo channel and/or the second pseudo channel according to an odd/even phase in which the single-UI command is located.

In some embodiments, the command mode includes a broadcast mode, and the register and divided clock driver is further configured to send the command to the first pseudo channel and the second pseudo channel simultaneously in the broadcast mode.

In some embodiments, in the broadcast mode, the first pseudo channel and the second pseudo channel work simultaneously.

In some embodiments, in the broadcast mode, two single-UI commands are sent to the pseudo channels in an odd phase and a consecutive even phases.

In some embodiments, in the broadcast mode, a single-UI command is sent to the first pseudo channel in an odd phase and the single-UI command is sent to the second pseudo channel in a consecutive even phase.

In some embodiments, in the broadcast mode, the first pseudo channel and the second pseudo channel are configured to send data to the combined data buffer simultaneously in response to the command.

In some embodiments, in the broadcast mode, the combined data buffer is configured to interleave the data of the first pseudo channel and the second pseudo channel directly.

In some embodiments, the command mode includes a directional mode, and the register and divided clock driver is further configured to send the command to the first pseudo channel or the second pseudo channel separately in the directional mode.

In some embodiments, in the directional mode, the first pseudo channel and the second pseudo channel are configured to send the data to the combined data buffer separately in response to the command.

In some embodiments, in the directional mode, the combined data buffer is configured to interleave the data of the first pseudo channel and the second pseudo channel.

In some embodiments, in the directional mode, the combined data buffer is configured to interleave data of one of the pseudo channels with dummy data when data of the other pseudo channel has not arrived.

In some embodiments, in the directional mode, the register and divided clock driver is further configured to determine, according to an odd/even phase in which the command is located, to send the command to the first pseudo channel or the second pseudo channel.

In some embodiments, in the directional mode, the register and divided clock driver sends a command received in an even phase to the first pseudo channel and a command received in an odd phase to the second pseudo channel.

In some embodiments, in the directional mode, the register and divided clock driver is further configured to determine, according to the flag bit of the double-UI command, to send the double-UI command to the first pseudo channel or the second pseudo channel.

In some embodiments, in the directional mode, the command is sent separately.

In some embodiments, in the directional mode, the first pseudo channel and the second pseudo channel work separately.

In some embodiments, the command mode includes a dynamic mode, and the register and divided clock driver is further configured to send, in the dynamic mode, the command to the first pseudo channel and the second pseudo channel simultaneously or separately.

In some embodiments, in the dynamic mode, the first pseudo channel and the second pseudo channel work simultaneously or separately.

In some embodiments, in the dynamic mode, the register and divided clock driver is further configured to determine according to an odd/even phase to send the command to the first pseudo channel or the second pseudo channel.

In some embodiments, in the dynamic mode, two single-UI commands are sent to the pseudo channels in an odd phase and a consecutive even phase.

In some embodiments, in the dynamic mode, a single-UI command is sent to the first pseudo channel in an odd phase and the single-cycle command is sent to the second pseudo channel in a consecutive even phase.

In some embodiments, for a write command, the combined data buffer is further configured to de-interleave data that need to be written to the first pseudo channel and/or the second pseudo channel.

In some embodiments, the first sub-channel and the second sub-channel share one said register and divided clock driver, and each group of the first pseudo channel and the second pseudo channel corresponds to one said combined data buffer.

In some embodiments, the command modes include a broadcast mode, a directional mode, and a dynamic mode, and the register and divided clock driver switches among the command modes.

In some embodiments, the register and divided clock driver include a flag bit register, where other devices perform odd/even phase synchronization with the register and divided clock driver via the flag bit register when the devices need to send commands to the register and divided clock driver.

In some embodiments, during a test stage of the high-bandwidth DDR DIMM, a test is performed on the high-bandwidth DDR DIMM in response to a command sent by a test bench.

In some embodiments, the flag bit register is configured prior to the start of the test, and the register and divided clock driver starts to perform odd/even phase synchronization in response to a NOP command sent by the test bench.

In some embodiments, after the odd/even phase synchronization, a corresponding test is performed in response to a formal command that the test bench starts to send after a preset clock cycle.

In accordance with another aspect of the present disclosure, there is provided a memory system including a central processing unit (CPU) and a high-bandwidth DDR DIMM described above, wherein the CPU is used as the host.

In accordance with yet another aspect of the present disclosure, there is provided an operation method of a memory system including a host and a high-bandwidth DDR DIMM, the operation method including:
  performing, by the host, odd/even phase synchronization with a register and divided clock driver of the high-bandwidth DDR DIMM;
  sending, by the host, a command to the register and divided clock driver; and
  determining, by the register and divided clock driver, a command mode according to the command, and sending the command to a first pseudo channel and/or a second pseudo channel of the high-bandwidth DDR DIMM according to the command mode or an odd/even phase in which the command is located, where each of the pseudo channels includes a plurality of DRAM chips.

In some embodiments, the host and the register and divided clock driver are both in odd phases or in even phases.

In some embodiments, when the register and divided clock driver works in the broadcast mode, the host sends a command to the register and divided clock driver in an even phase, and after waiting for an input clock cycle that lasts as long as the command, continues to send another command to the register and divided clock driver in an even phase.

In some embodiments, the register and divided clock driver sends the received commands to the first pseudo channel and the second pseudo channel simultaneously, where an even-numbered input clock cycle of the register and divided clock driver corresponds to an even-numbered phase of the host.

In some embodiments, when the register and divided clock driver works in a directional mode or dynamic mode, the register and divided clock driver determines, according to an odd/even phase in which a single-UI command is located, to send the single-UI command to the first pseudo channel or the second pseudo channel.

In some embodiments, the host configures at least one reserved bit in a double-UI command as a flag bit to indicate the command mode of the register and divided clock driver, and/or to instruct the register and divided clock driver to send the command to the first pseudo channel or the second pseudo channel.

In some embodiments, when the register and divided clock driver works in a dynamic mode, the host interleaves/de-interleaves data of the first pseudo channel and the second pseudo channel.

In some embodiments, during an initialization stage of the high-bandwidth DDR DIMM or a self-refresh stage of clock-off, the host performs odd/even phase synchronization with the register and divided clock driver.

Overall, the above technical schemes conceived in the present disclosure have the following beneficial effects compared to the prior art: according to different command modes and/or the odd/even phase where the command is located, the register and divided clock driver correspondingly sends the command to a plurality of pseudo channels simultaneously or separately, thus realizing faster and more effective data reading; by performing odd/even phase synchronization with the host, accurate response to the command is achieved according to the odd/even phase of the received command, and the command can be sent to the corresponding pseudo channel according to the odd/even phase or flag bit of the command, thus improving the overall performance of signal reading and transmission; and the above technical schemes of the present disclosure are applicable to more application scenarios without changing the original command format and sending approach, thus having good compatibility.

DETAILED DESCRIPTION

In order to make the objectives, technical schemes and advantages of the present disclosure more apparent, the present disclosure is further described in detail in conjunction with the accompanying drawings and embodiments. It should be understood that the specific embodiments described here are intended only to explain the present disclosure and are not intended to limit the present disclosure. As can be recognized by those skilled in the art, the described embodiments may be modified in a variety of different ways without departing from the principle or scope of the present application. Accordingly, the accompanying drawings and description are considered to be exemplary rather than limiting in nature.

Figure 1:
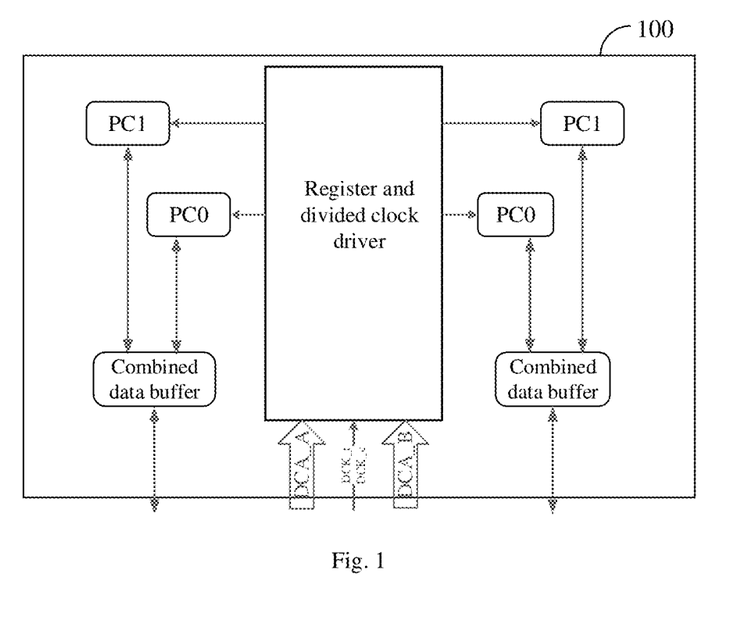
FIG. 1 is a schematic diagram of a high-bandwidth DDR DIMM 100 of an embodiment of the present disclosure.

FIG. 1 illustrates a schematic diagram of a high-bandwidth DDR DIMM 100 of an embodiment of the present disclosure. As shown in FIG. 1, each high-bandwidth DDR DIMM 100 is divided left and right into two sub-channels, and each sub-channel is further divided into two sides, and each side is referred to as a pseudo channel (PC), i.e., PC0 and PC1 in FIG. 1. Each pseudo channel includes a plurality of DRAM chips (not shown in FIG. 1) for operations such as data writing and reading. In the embodiments of the present disclosure, since the frequency (e.g., 6.4 GHz) of the DCA is twice the frequency (e.g., 3.2 GHz) of the QCA, the name register clock driver (RCD) is no longer appropriate and the following more specific name will be used below to avoid confusion: register and divided clock driver (RDCD). In addition, the name of combined data buffer (CDB) will also be used below to emphasize the combined functionality of the data buffer.

In the embodiments of the present disclosure, the high-bandwidth DDR DIMM 100 further includes a register and divided clock driver configured to determine a command mode in response to a command sent by a host and send the received command to pseudo channel(s) PC0 and/or PC1 according to different command modes. The high-bandwidth DDR DIMM 100 further includes a combined data buffer configured to interleave data of pseudo channels PC0 and PC1. It can be understood that for a write command, the combined data buffer is further configured to de-interleave data that need to be written to pseudo channel(s) PC0 and/or PC1. In the embodiments of the present disclosure, the two sub-channels of the high-bandwidth DDR DIMM 100 share one register and divided clock driver, and each group of pseudo channels PC0 and PC1 correspond to one combined data buffer, where the two sub-channels have the same structure. It can be understood that the schematic diagram given here is only an example, and the present disclosure does not limit other structure variations that can be used.

Since in the high-bandwidth DDR DIMM 100, the frequency of the DCA interface is twice that of the QCA interface, to ensure the accuracy of command response, the host needs to know exactly from which clock cycle the command was sent. In some embodiments, an odd-numbered input clock cycle of the register and divided clock driver is referred to as an odd phase, and an even-numbered input clock cycle thereof is referred to as an even phase. An odd-numbered input clock cycle of the register and divided clock driver corresponds to an odd-numbered phase of the host, and an even-numbered input clock cycle of the register and divided clock driver corresponds to an even-numbered phase of the host. Specifically, for an output clock (QCK) cycle, the first input clock (DCK) cycle (cycle 0) corresponds to an even phase, the second DCK cycle (cycle 1) corresponds to an odd phase, and so on. In some embodiments, it is required that the host and the register and divided clock driver maintain a synchronized odd/even phase, that is, the host and the register and divided clock driver are both in an odd phase or in an even phase.

In some embodiments, a double-unit interval (UI) command sent by the host has at least one flag bit, and the register and divided clock driver selects a command mode from a plurality of different command modes according to the flag bit. In some embodiments, the register and divided clock driver further sends the command to pseudo channel(s) PC0 and/or PC1 according to an odd/even phase in which a single-UI command sent from the host is located. In the embodiments of the present disclosure, the command modes specifically include a broadcast mode, a directional mode, and a dynamic mode. The register and divided clock driver may be switched among the variety of different command modes to select an appropriate command mode according to the actual needs so as to improve the efficiency of signal transmission, thus enhancing the overall system performance.

Figure 2:
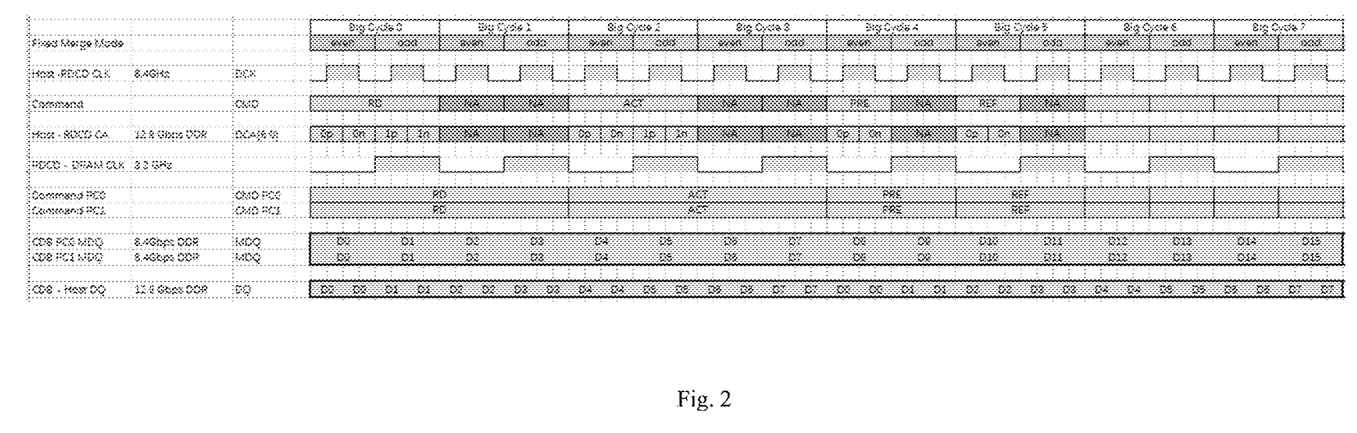
FIG. 2 is a schematic diagram of signal transmission in a broadcast mode of an embodiment of the present disclosure.

FIG. 2 illustrates a schematic diagram of signal transmission in the broadcast mode of an embodiment of the present disclosure. In the embodiments of the present disclosure, the first DCK cycle is an even phase and the second DCK cycle is an odd phase, and the two DCK cycles may be referred to as one big cycle that corresponds to one output clock (QCK) cycle. The register and divided clock driver is further configured to send the command to the first pseudo channel and the second pseudo channel simultaneously in the broadcast mode. Specifically, when the register and divided clock driver receives a command sent from the host and determines based on a flag bit therein that it is in the broadcast mode, the register and divided clock driver sends the received command to pseudo channels PC0 and PC1 simultaneously. That is, in the broadcast mode, pseudo channels PC0 and PC1 work simultaneously.

As shown in FIG. 2, in the broadcast mode, when the register and divided clock driver receives a read command (RD) in big cycle 0, it sends the read command (referred to CMD PC0 for pseudo channel PC0 and CMD PC1 for pseudo channel PC1) to pseudo channels PC0 and PC1 simultaneously. In response to this read command, data (e.g., D0, D1, etc.) of pseudo channels PC0 and PC1 are sent to the combined data buffer simultaneously. The combined data buffer interleaves the data from pseudo channels PC0 and PC1. Since the data of pseudo channels PC0 and PC1 are sent simultaneously in the broadcast mode, the combined data buffer interleaves the first data (D0) received from pseudo channel PC0 and the first data (D0) received from pseudo channel PC1, and interleaves the second data (D1) received from pseudo channel PC0 and the second data (D1) received from pseudo channel PC1, and so on.

Figure 3:
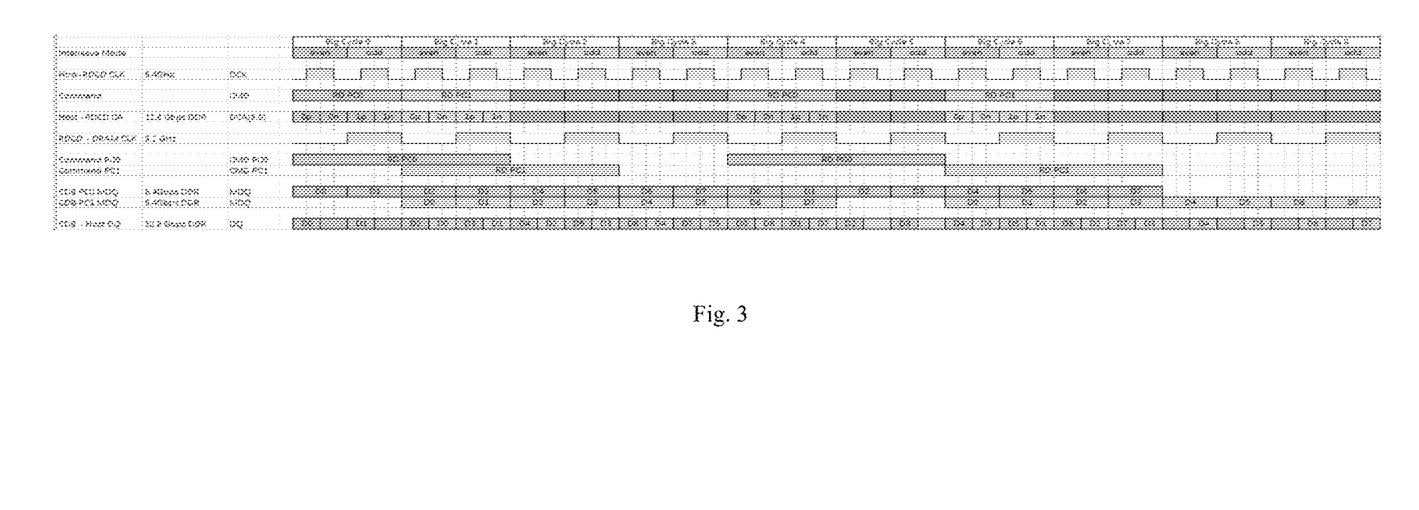
FIG. 3 is a schematic diagram of signal transmission in a directional mode of an embodiment of the present disclosure.

FIG. 3 illustrates a schematic diagram of signal transmission in the directional mode of an embodiment of the present disclosure. When the register and divided clock driver receives a command sent from the host and determines based on a flag bit therein that it is in the directional mode, the register and divided clock driver is further configured to send the command to the first pseudo channel or the second pseudo channel separately. In response to this command, the first pseudo channel PC0 and the second pseudo channel PC1 send data to the combined data buffer separately. Specifically, when the register and divided clock driver receives a read command (RD), it sends the read command (referred to CMD PC0 for pseudo channel PC0 and CMD PC1 for pseudo channel PC1) to pseudo channels PC0 and PC1 separately, and pseudo channels PC0 and PC1 send the data to the combined data buffer separately in response to the read command In the directional mode, pseudo channels PC0 and PC1 may work separately.

As shown in FIG. 3, in the directional mode, the command RD PC0 to read pseudo channel PC0 is sent in the first even phase (within big cycle 0), and the command RD PC1 to read pseudo channel PC1 is sent in the second even phase (within big cycle 1). When the register and divided clock driver receives the command RD PC0 in big cycle 0, it sends the command to pseudo channel PC0, and when it receives the command RD PC1 in big cycle 1, it sends the command to pseudo channel PC1. In response to this read command, the data (e.g., D0, D1, etc.) of pseudo channel PC0 is sent to the combined data buffer from big cycle 0, and the data (e.g. D0, D1, etc.) on the pseudo channel PC1 is sent to the combined data buffer from big cycle 1.

The combined data buffer interleaves the data from pseudo channels PC0 and PC1. Since the data of pseudo channels PC0 and PC1 are sent separately in the directional mode, the time to reach the combined data buffer is not consistent. When data of one pseudo channel (e.g., PC1) has not arrived, the combined data buffer interleaves data of the other pseudo channel (e.g., PC0) with dummy data to ensure the correct format of data transmission. As shown in FIG. 3, in big cycle 0, the combined data buffer receives the data D0 and D1 of pseudo channel PC0, while the data of pseudo channel PC1 has not arrived yet, so it interleaves the data D0 and D1 of pseudo channel PC0 with dummy data separately. Within big cycle 1, the data of pseudo channel PC1 begins to arrive, then the data D2 and D3 of pseudo channel PC0 is interleaved with the data D0 and D1 of pseudo channel PC1, respectively, and so on. In some embodiments, when one pseudo channel (e.g., PC0) has finished data transmission and the other pseudo channel (e.g., PC1) is still in the middle of data transmission, the combined data buffer interleaves the data received from pseudo channel PC1 with dummy data. It can be understood that the dummy data used for interleaving may be any data, for example, all-1 data, and the present disclosure is not limited in this regard.

In some embodiments, in response to a write command, the combined data buffer is further configured to de-interleave the data and then write the de-interleaved data to the corresponding pseudo channel(s) PC0 and/or PC1.

Unlike the broadcast mode described above, in the directional mode, the register and divided clock driver needs to send the command to the corresponding pseudo channel PC0 or PC1, so as to ensure the accuracy of the sending of the command/data. In some embodiments, in the directional mode, the register and divided clock driver is further configured to determine according to an odd/even phase to send the command to the first pseudo channel or the second pseudo channel. For example, a command received by the register and divided clock driver in an even phase will be sent to pseudo channel PC0, and a command received in an odd phase will be sent to pseudo channel PC1. In the directional mode, the register and divided clock driver is further configured to use a reserved or idle bit in the command as a flag bit, and send the command to different pseudo channels according to this flag bit. For example, when the flag bit is 0, the register and divided clock driver sends the command to pseudo channel PC0, and when the flag bit is 1, the register and divided clock driver sends the command to pseudo channel PC1. This enables the correct sending of the command without changing the original command format.

In some embodiments, the command mode of the register and divided clock driver further includes a dynamic mode. In the dynamic mode, the register and divided clock driver sends the received command to pseudo channels PC0 and PC1 simultaneously or separately, and pseudo channels PC0 and PC1 can work simultaneously or separately, thus maximizing the overall system performance.

It can be understood that for a double-UI command, like for a standard DDR5 command, a continuous sending approach is maintained. For a double-UI command, there are relatively more flag bits that can be used because of the higher number of reserved or idle bits. In some embodiments, the register and divided clock driver determines the command mode according to at least one flag bit in the double-UI command and determines, according to another flag bit, to send the command to pseudo channel PC0 or PC1. In some other embodiments, the register and divided clock driver determines the command mode according to at least one flag bit in the double-UI command and determines, according to an odd/even phase in which the double-UI command is located, to send the command to pseudo channel PC0 or PC1. For a single-UI command, it is possible to not set a flag bit to indicate its command mode, and for the directional mode, the register and divided clock driver determines, according to an odd/even phase in which the single-UI command is located, to send the command to pseudo channel PC0 or PC1. For the broadcast/dynamic mode, if a single-UI command requires the command be sent to both pseudo channels simultaneously, it is only necessary to send two single-UI commands at odd and even phases within one big cycle. The specific way of setting the command mode may be adjusted according to the actual application scenarios, and the present disclosure is not limited in this regard.

In some embodiments, the register and divided clock driver includes a flag bit register. Other devices perform odd/even phase synchronization with the register and divided clock driver via the flag bit register when the devices need to send commands to the register and divided clock driver. For example, during a test stage of the high-bandwidth DDR DIMM 100, a test bench board needs to send a command to the high-bandwidth DDR DIMM 100 to test whether the functionality of the high-bandwidth DDR DIMM 100 is intact. Before the test bench master sends the command to the high-bandwidth DDR DIMM 100, it needs to configure this flag bit register via a system management bus (SMBUS) and then send a NOP command to the register and divided clock driver to start performing odd/even phase synchronization, and then starts to send a formal command after a preset clock cycle to perform the corresponding test.

Using the high-bandwidth DDR DIMM of the embodiments of the present disclosure, by correspondingly sending a command to a plurality of pseudo channels simultaneously or separately depending on different command modes, data can be read faster and more effectively; and by performing odd/even phase synchronization with the host, accurate response to the command is achieved according to the odd/even phase of the received command, and the command can be sent to the corresponding pseudo channel according to the odd/even phase in which the command is located or the flag bit without having to change the original command format and sending approach, thus improving the overall performance of signal reading and transmission and effectively solving the problem of the I/O speed gap between the DRAM and the host/controller.

Figure 4:
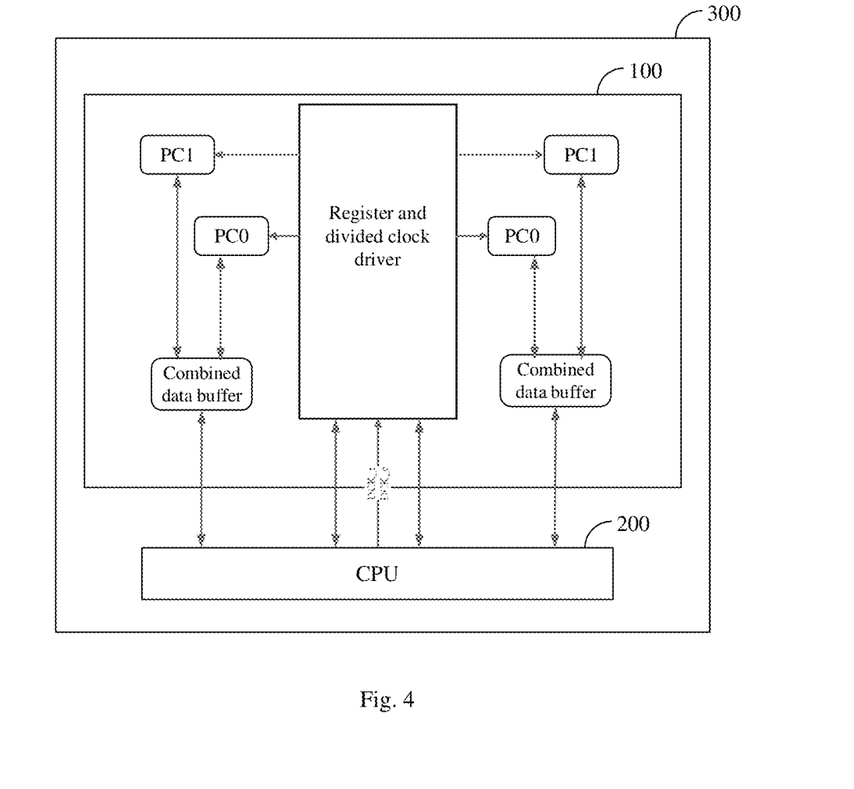
FIG. 4 is a schematic diagram of a high-bandwidth memory system of an embodiment of the present disclosure.

FIG. 4 illustrates a schematic diagram of a high-bandwidth memory system 300 of an embodiment of the present disclosure, which includes a CPU 200 and a high-bandwidth DDR DIMM 100 as described above. It can be understood that this FIG. 4 provides only exemplary connection and signal transmission relationships for some modules, and other modules such as the memory controller (MC) are not shown in the drawing. In some embodiments, CPU 200 is used as a host to send to the high-bandwidth DDR DIMM 100 a command as well as data to be written to DRAM chips, and further to receive data read from the high-bandwidth DDR DIMM 100. The register and divided clock driver of the high-bandwidth DDR DIMM 100 is configured to determine different command modes according to the command sent from the host, and to send the command to the corresponding pseudo channels simultaneously or separately according to the corresponding command modes. The combined data buffer of the high-bandwidth DDR DIMM 100 is configured to interleave the data of the two pseudo channels according to the corresponding command mode. It can be understood that for a write command, the combined data buffer is further configured to de-interleave data that need to be written to the two pseudo channels.

For more specific implementations of the various modules of the high-bandwidth memory system, reference can be made to the description of the high-bandwidth DDR DIMM of the present disclosure, which have similar beneficial effects and will not be repeated here.

Figure 5:
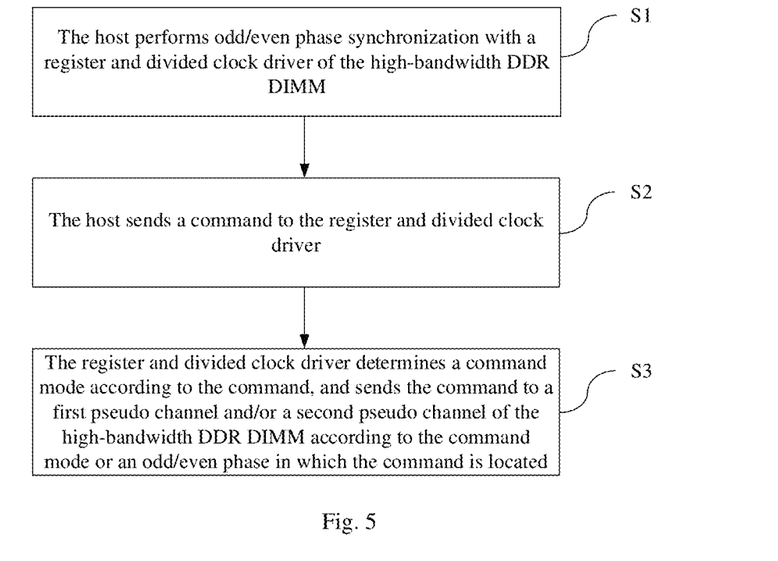
FIG. 5 is a flowchart of an operation method of a high-bandwidth memory system of an embodiment of the present disclosure.

FIG. 5 illustrates a flowchart of an operation method of a high-bandwidth memory system of an embodiment of the present disclosure, which specifically includes the following steps.

At S1, the host performs odd/even phase synchronization with a register and divided clock driver of the high-bandwidth DDR DIMM. In some embodiments, since the frequency of the DCA interface is twice that of the QCA interface, to ensure the accuracy of command response, the host needs to know exactly whether the command is sent from an even phase (e.g., the first input clock cycle, cycle 0) or from an odd phase (e.g., the first input clock cycle, cycle 1). Therefore, the host needs to perform odd/even phase synchronization with the register and divided clock driver of the high-bandwidth DDR DIMM, so that the host and the register and divided clock driver are both in an odd phase or in an even phase.

At S2, the host sends a command to the register and divided clock driver. In some embodiments, the host selects, according to the actual command sending requirements, one of the command modes including a broadcast mode, a directional mode, and a dynamic mode, the register and divided clock driver is to work in. The host uses at least one bit that is reserved/idle in the command as a flag bit to indicate the command mode of the register and divided clock driver without changing the original command format and sending approach. Specifically, for example, CID3 reserved in high bits of the existing command is used to indicate whether the register and divided clock driver is to work in the broadcast mode or the directional mode, and an odd/even phase of the sent command is used to indicate that this command is to be sent to pseudo channel(s) PC0 and/or PC1. It can be understood that the host may also indicate more different command modes using more reserved/idle bits in a double-UI command, and for a single-UI command, may or may not use a flag bit to indicate its command mode, and the present disclosure is not limited in this regard.

In some embodiments, when the command that needs to be sent is in the broadcast mode, the host sends the command to the register and divided clock driver in an even phase, and after waiting for an input clock cycle that lasts as long as the command, continues to send the command to the register and divided clock driver in an even phase. Specifically, taking FIG. 2 as an example, in the broadcast mode, after sending a read command (RD) in an even phase, the host needs to wait for one big cycle (Big Cycle 1) and continues to send other commands (e.g., ACT) in an even phase in the next big cycle (Big Cycle 2).

In some embodiments, when the command that needs to be sent is in the directional mode, the host does not need to specify that the command be sent to the register and divided clock driver at an even phase, nor does it need to wait for an input clock cycle that lasts as long as the command before sending the next command Therefore, the host needs to know the order in which the commands are sent and selects the valid data according to preset timing parameters, that is, the host selects the valid data corresponding to the command from the returned data based on the timing parameters, so as to ensure the accuracy of data transmission.

In some embodiments, when the command that needs to be sent is in the dynamic mode, the host needs to interleave/de-interleave the data of the two pseudo channels so that the data can be subsequently accessed separately in the directional mode.

In some embodiments, the command sent by the host also needs to specify to which pseudo channel it is to be sent by the register and divided clock driver. Specifically, for a single-UI command, the host uses an odd/even phase or 1 flag bit to indicate that the command is to be sent to a corresponding pseudo channel. For example, after the host has performed odd/even phase synchronization with the register and divided clock driver, in either the directional mode or dynamic mode, commands sent by the host in even phases are all sent to pseudo channel PC0 by the register and divided clock driver, and commands sent by the host in odd phases are all sent to pseudo channel PC1 by the register and divided clock driver. Alternatively, the host uses a reserved or idle bit in the command as a flag bit, and the command is sent to pseudo channel PC0 by the register and divided clock driver when the flag bit is 0, and to pseudo channel PC1 by the register and divided clock driver when the flag bit is 1.

For a double-UI command, since such a command has more data bits, the host may use one of the reserved or idle bits of the command as a flag bit to indicate which pseudo channel to send the command to, and use another bit as a flag bit to indicate the working mode. For example, for a double-UI command, CID2 in the command may be selected as the flag bit to make the selection of a pseudo channel; and CID3 may be selected as another flag bit to indicate the dynamic mode.

At S3, the register and divided clock driver determines a command mode according to the command, and sends the command to a first pseudo channel and/or a second pseudo channel of the high-bandwidth DDR DIMM according to the command mode or an odd/even phase in which the command is located, where each of the pseudo channels includes a plurality of DRAM chips. In some embodiments, in the broadcast mode, the first pseudo channel and the second pseudo channel work simultaneously; in the directional mode, the first pseudo channel and the second pseudo channel work separately; and in the dynamic mode, the first pseudo channel and the second pseudo channel may work simultaneously or separately.

In some embodiments, in different command modes, the register and divided clock driver sends a command to the first pseudo channel and/or the second pseudo channel in different manners. In the broadcast mode, the register and divided clock driver sends the command to pseudo channels PC0 and PC1 simultaneously; in the directional mode, the register and divided clock driver sends the command to pseudo channels PC0 and PC1 separately; and in the dynamic mode, the register and divided clock driver sends the command to pseudo channels PC0 and PC1 simultaneously or separately.

In some embodiments, in the directional or dynamic mode, the register and divided clock driver determines, according to the odd/even phase in which the command is sent, or the reserved/idle bit in the command as the flag bit, to send the command to pseudo channel PC0 or PC1.

In some embodiments, the combined data buffer interleaves data of pseudo channels PC0 and PC1. In the broadcast mode, for pseudo channels PC0 and PC1, there are no dummy data in data that have been interleaved by the combined data buffer; and in the directional mode, for pseudo channels PC0 and PC1, there may exist dummy data in the data that have been interleaved by the combined data buffer.

In some embodiments, during an initialization stage of the high-bandwidth DDR DIMM or a self-refresh stage of clock-off, the host performs an operation of odd/even phase synchronization with the register and divided clock driver. It can be understood that the host and the register and divided clock driver may also re-perform odd/even phase synchronization when otherwise necessary, and the present disclosure is not limited in this regard.

In the embodiments of the present disclosure, the DRAM chips may be DDR4, DDR5, DDR6, LPDDR or GDDR, and may also be LPDDR4, LPDDR5 or LPDDR5x, and may also be other forms of DRAM chips, and the present disclosure is not limited in this regard.

Using the operation method of the memory system of an embodiment of the present disclosure, the host performs odd/even phase synchronization with the register and divided clock driver of the high-bandwidth DDR DIMM to ensure the accuracy of responding to commands sent by the host. After the odd/even phase synchronization, by means of at least one flag bit of a to-be-sent command or an odd/even phase in which the command is located, the host achieves a variety of different allocation methods for the command, thus enabling more effective command transmission and faster data reading. In addition, by using a preset or idle data bit in the command as a flag bit, and/or using an odd/even phase of the command, to accurately instruct the register and divided clock driver to send the command to a corresponding pseudo channel, the accuracy of signal response is ensured, so that the operation method is applicable to more application scenarios without changing the existing command format and sending approach, thus having good compatibility.

In this specification, the description with reference to terms such as "one embodiment", "some embodiments", "example", "specific example", and "some examples" means that the specific features, structures, materials or features described in conjunction with the embodiment(s) or example(s) are included in at least one embodiment or example of the present application. Moreover, the specific features, structures, materials or characteristics described can be combined in any one or more embodiments or examples in any suitable manner. In addition, those skilled in the art can integrate and combine different embodiments or examples and features of different embodiments or examples described in this specification without contradicting each other.

In addition, the terms "first" and "second" are for the purpose of description only and should not be construed as indicating or implying relative importance or implicitly indicating the number of technical features indicated. Therefore, the features defined with "first" and "second" may explicitly or implicitly include at least one of the features. In the description of the present application, the term "plurality" means two or more, unless otherwise explicitly and specifically defined.

Any process or method description described in a flowchart or otherwise described herein may be understood as representing a module, fragment, or portion of code including one or more (two or more) executable commands for implementing specific logical functions or steps of the process. In addition, the scope of the preferred embodiments of the present application includes additional implementations in which the functions may be performed not in the order shown or discussed, including in a substantially simultaneous manner or in the reverse order depending on the functions involved.

The logic and/or steps denoted in the flowchart or otherwise described herein, for example, may be considered as an order-defined list of executable commands for implementing the logical functions, and may be specifically implemented in any computer-readable medium for use by a command execution system, apparatus, or device (e.g., a computer-based system, a system including a processor, or other system that can read commands from the command execution system, apparatus, or device and execute the command) or use in combination with such a command execution system, apparatus, or device.

It should be understood that the various parts of the present application may be implemented in hardware, software, firmware, or a combination thereof. In the above embodiments, a plurality of steps or methods may be implemented using software or firmware that is stored in memory and executed by a suitable instruction execution system. All or some of the steps of the methods of the above embodiments may be accomplished by instructing the relevant hardware by means of a program which may be stored in a computer-readable storage medium and, when executed, includes one of the steps of the method embodiments or a combination thereof.

Further, the functional units in each embodiment of the present application may be integrated into one processing module, or each unit may be physically separate, or two or more units may be integrated into one module. The integration module can be realized either in the form of hardware or in the form of a software functional module. The above integrated modules may also be stored in a computer-readable storage medium when implemented in the form of functional modules of software and sold or used as an independent product. The storage medium may be a read-only memory, a magnetic disk, an optical disk, etc.

Only some specific embodiments of the present application are described above, and the scope of protection of the present application is not limited thereto. Any changes or substitutions that can be readily conceived by those skilled in the art within the technical scope disclosed by the present application shall fall within the scope of protection of the present application. Therefore, the scope of protection of the present application should be subject to the scope of protection of the claims.

The invention claimed is:

1. A high-bandwidth double data rate (DDR) dual-in-line memory module (DIMM), comprising: a first sub-channel, a second sub-channel, a register and divided clock driver, and a combined data buffer, wherein the first sub-channel comprises a first pseudo channel and a second pseudo channel, the second sub-channel comprises a third pseudo channel and a fourth pseudo channel, each pseudo channel comprising a plurality of dynamic random-access memory (DRAM) chips; the register and divided clock driver is configured to determine a command mode in response to a command sent by a host and send the command to the first pseudo channel, the second pseudo channel, the third pseudo channel, and/or the fourth pseudo channel according to the command mode; and the combined data buffer is configured to interleave data of the first pseudo channel and the second pseudo channel.

2. The high-bandwidth DDR DIMM of claim 1, wherein the register and divided clock driver is further configured to perform, in response to an input clock cycle thereof, odd/even phase synchronization with the host, wherein an odd-numbered input clock cycle of the register and divided clock driver corresponds to an odd-numbered phase of the host, and an even-numbered input clock cycle of the register and divided clock driver corresponds to an even-numbered phase of the host.

3. The high-bandwidth DDR DIMM of claim 2, wherein in the case where a double-UI command is sent by the host, the register and divided clock driver is further configured to select a command mode from a plurality of different command modes according to at least one flag bit in the double-UI command; and in the case where a single-UI command is sent by the host, the register and divided clock driver is further configured to send the single-UL command to the first pseudo channel and/or the second pseudo channel according to an odd/even phase in which the single-UI command is located.

4. The high-bandwidth DDR DIMM of claim 2, wherein the command mode comprises a broadcast mode, and the register and divided clock driver is further configured to send the command to the first pseudo channel and the second pseudo channel simultaneously in the broadcast mode.

5. The high-bandwidth DDR DIMM of claim 4, wherein in the broadcast mode, the first pseudo channel and the second pseudo channel are configured to send data to the combined data buffer simultaneously in response to the command.

6. The high-bandwidth DDR DIMM of claim 4, wherein in the broadcast mode, the combined data buffer is configured to interleave the data of the first pseudo channel and the second pseudo channel directly.

7. The high-bandwidth DDR DIMM of claim 2, wherein the command mode comprises a directional mode, and the register and divided clock driver is further configured to send the command to the first pseudo channel or the second pseudo channel separately in the directional mode.

8. The high-bandwidth DDR DIMM of claim 7, wherein in the directional mode, the first pseudo channel and the second pseudo channel are configured to send the data to the combined data buffer separately in response to the command.

9. The high-bandwidth DDR DIMM of claim 7, wherein in the directional mode, the combined data buffer is configured to interleave data of one of the pseudo channels with dummy data when data of the other pseudo channel has not arrived.

10. The high-bandwidth DDR DIMM of claim 7, wherein in the directional mode, the register and divided clock driver is further configured to determine, according to an odd/even phase in which the command is located and/or at least one flag bit, to send the command to the first pseudo channel or the second pseudo channel.

11. The high-bandwidth DDR DIMM of claim 2, wherein the command mode comprises a dynamic mode, and the register and divided clock driver is further configured to determine in the dynamic mode according to an odd/even phase to send the command to the first pseudo channel and the second pseudo channel simultaneously or send the command to the first pseudo channel or the second pseudo channel separately.

12. The high-bandwidth DDR DIMM of claim 1, wherein the register and divided clock driver comprises a flag bit register, wherein other devices perform odd/even phase synchronization with the register and divided clock driver via the flag bit register when the devices need to send commands to the register and divided clock driver.

13. The high-bandwidth DDR DIMM of claim 12, wherein during a test stage of the high-bandwidth DDR DIMM, a test is performed on the high-bandwidth DDR DIMM in response to a command sent by a test bench; the flag bit register is configured prior to the start of the test, and the register and divided clock driver starts to perform odd/even phase synchronization in response to a NOP command sent by the test bench; and after the odd/even phase synchronization, a corresponding test is performed in response to a formal command that the test bench starts to send after a preset clock cycle.

14. A memory system, comprising a central processing unit (CPU) and a high-bandwidth double data rate (DDR) dual-in-line memory module (DIMM), wherein
    the high-bandwidth DDR DIMM comprises: a first sub-channel, a second sub-channel, a register and divided clock driver, and a combined data buffer, wherein the first sub-channel comprises a first pseudo channel and a second pseudo channel, the second sub-channel comprises a third pseudo channel and a fourth pseudo channel, each pseudo channel comprising a plurality of dynamic random-access memory (DRAM) chips; the register and divided clock driver is configured to determine a command mode in response to a command sent by the CPU and send the command to the first pseudo channel and/or the second pseudo channel according to the command mode; and the combined data buffer is configured to interleave data of the first pseudo channel and the second pseudo channel.

15. An operation method of a memory system comprising a host and a high-bandwidth double data rate (DDR) dual-in-line memory module (DIMM), the operation method comprising:

performing, by the host, odd/even phase synchronization with a register and divided clock driver of the high-bandwidth DDR DIMM;

sending, by the host, a command to the register and divided clock driver; and determining, by the register and divided clock driver, a command mode according to the command, and sending the command to a first pseudo channel and/or a second pseudo channel of the high-bandwidth DDR DIMM according to the command mode or an odd/even phase in which the command is located, wherein each of the pseudo channels comprises a plurality of DRAM chips.

16. The operation method of claim 15, wherein when the register and divided clock driver works in a broadcast mode, the host sends a command to the register and divided clock driver in an even phase, and after waiting for an input clock cycle that lasts as long as the command, continues to send another command to the register and divided clock driver in an even phase; and the register and divided clock driver sends the received commands to the first pseudo channel and the second pseudo channel simultaneously, wherein an even-numbered input clock cycle of the register and divided clock driver corresponds to an even-numbered phase of the host.

17. The operation method of claim 15, wherein when the register and divided clock driver works in a directional mode or dynamic mode, the register and divided clock driver determines, according to an odd/even phase in which a single-UI command is located, to send the single-UI command to the first pseudo channel or the second pseudo channel.

18. The operation method of claim 15, wherein the host configures at least one reserved bit in a double-UI command as a flag bit to indicate the command mode of the register and divided clock driver, and/or to instruct the register and divided clock driver to send the command to the first pseudo channel or the second pseudo channel.

19. The operation method of claim 15, wherein when the register and divided clock driver works in a dynamic mode, the host interleaves/de-interleaves data of the first pseudo channel and the second pseudo channel.

20. The operation method of claim 15, wherein during an initialization stage of the high-bandwidth DDR DIMM or a self-refresh stage of clock-off, the host performs odd/even phase synchronization with the register and divided clock driver.

* * * * *